US010043668B1

(12) United States Patent
Engelmann et al.

(10) Patent No.: US 10,043,668 B1
(45) Date of Patent: *Aug. 7, 2018

(54) SELECTIVE DRY ETCH FOR DIRECTED SELF ASSEMBLY OF BLOCK COPOLYMERS

(71) Applicant: International Business Machines Corporation, Armonk, NY (US)

(72) Inventors: Sebastian U. Engelmann, White Plains, NY (US); Ashish V. Jagtiani, Tarrytown, NY (US); Hiroyuki Miyazoe, White Plains, NY (US); Hsinyu Tsai, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/838,485

(22) Filed: Dec. 12, 2017

Related U.S. Application Data

(63) Continuation of application No. 15/413,928, filed on Jan. 24, 2017.

(51) Int. Cl.
| | |
|---|---|
| *H01L 21/311* | (2006.01) |
| *H01L 21/027* | (2006.01) |
| *H01L 21/02* | (2006.01) |

(52) U.S. Cl.
CPC ...... *H01L 21/0273* (2013.01); *H01L 21/0228* (2013.01); *H01L 21/02118* (2013.01); *H01L 21/02274* (2013.01); *H01L 21/31138* (2013.01)

(58) Field of Classification Search
USPC .................................................. 438/706, 695
See application file for complete search history.

(56) References Cited

PUBLICATIONS

List of IBM Patents or Patent Applications Treated As Related; (Appendix P), Date Filed Dec. 12, 2017; 2 pages.
Sebastian U. Engelmann, et al., Pending U.S. Appl. No. 15/413,928 entitled "Selective Dry Etch For Directed Self Assembly of Block Copolymers," filed Jan. 24, 2017.

*Primary Examiner* — Roberts Culbert
(74) *Attorney, Agent, or Firm* — Cantor Colburn LLP; David Quinn

(57) ABSTRACT

Methods for preparing a patterned directed self-assembly layer generally include providing a substrate having a block copolymer layer including a first phase-separated polymer defining a first pattern in the block copolymer layer and a second phase-separated polymer defining a second pattern in the block copolymer layer. The block polymer layer is exposed to a gas pulsing carbon monoxide polymer. The gas pulsing is configured to provide multiple cycles of an etching plasma and a deposition plasma to selectively remove the second pattern of the second phase-separated polymer while leaving behind the first pattern of the first phase-separated polymer on the substrate.

13 Claims, 5 Drawing Sheets

US 10,043,668 B1

SELECTIVE DRY ETCH FOR DIRECTED SELF ASSEMBLY OF BLOCK COPOLYMERS

DOMESTIC PRIORITY

The present application is a CONTINUATION of U.S. application Ser. No. 15/413,928, filed on Jan. 24, 2017, the contents of which are incorporated herein by reference in its entirety.

BACKGROUND

The present invention relates to semiconductor integrated circuits and a method of fabrication thereof, with particular application to a selective dry etch process of block copolymers used in directed self-assembly (DSA) processes. More particularly, the dry etch process includes gas pulsing carbon-monoxide based plasmas to selectively remove one block polymer in the block copolymer.

Block copolymer lithography is becoming an established DSA technique for patterning beyond optical lithography applications. DSA is based on combining the intrinsic property of block copolymers to phase separate at the molecular scale with the capabilities of conventional top-down lithographic methods for patterning surfaces. Guiding the self-assembly of block copolymers by surface modification is one of the most used processes to drive the self-assembly in a convenient way. It typically consists of using lithography and an oxygen based plasma to create different wettability regions on a polymer brush material grafted onto the surface.

The directed self-assembly can be a graphoepitaxy process or chemoepitaxy process. In the graphoepitaxy process, the self-organization of the block copolymers is guided by topographical guiding patterns such that the block copolymer self-organizes in useful domains, which is dominated by the concept of confinement. Neutral walls or pillars that define the guiding pattern prevent certain chain configurations, which then lead to the polymer adjusting its periodic structure along a pre-determined axis. In the chemoepitaxy process, local variations in the surface energy of the layer to which the DSA material is applied dictate how the block copolymers will align. Through subsequent selective removal of one polymer type, a patterned structure of gaps is formed which can be used in a manner similar to a resist layer on the underlying substrate.

SUMMARY OF THE INVENTION

The present invention is directed to a highly selective dry etch process for block copolymers used in directed self-assembly.

In one or more embodiments of the invention, a method for preparing a patterned directed self-assembly layer includes providing a substrate having a block copolymer layer. The block copolymer layer includes a first phase-separated polymer defining a first pattern in the block copolymer layer and a second phase-separated polymer defining a second pattern in the block copolymer layer. The block copolymer layer is exposed to a plasma formed of a gas mixture including an etchant gas and carbon monoxide. The plasma selectively removes the second pattern of the second phase-separated polymer while leaving behind the first pattern of the first phase-separated polymer on the substrate. Exposing the block copolymer layer to the plasma includes providing multiple cycles of an etching plasma and a deposition plasma from the gas mixture.

In one or more embodiments of the invention, a method for selectively removing poly(methyl methacrylate) from a poly(styrene-b-methyl methacrylate) block copolymer includes depositing and annealing the poly(styrene-b-methyl methacrylate) block copolymer layer on a neutral layer to form a first phase-separated polystyrene polymer defining a first pattern and a second phase-separated poly(methyl methacrylate) polymer defining a second pattern in the block copolymer layer. The block copolymer layer is exposed to multiple cycles of an etching plasma and a deposition plasma generated from a gas mixture containing an etchant gas and carbon monoxide gas. Each cycle selectively removes a portion of the poly(methyl methacrylate) polymer and deposits a carbon based plasma byproduct onto the polystyrene polymer. Each cycle is repeated until complete removal of the second phase-separated polymer.

In one or more embodiments of the invention, a method for selectively removing poly(methyl methacrylate) from a poly(styrene-b-methyl methacrylate) block copolymer includes depositing and annealing a poly(styrene-b-methyl methacrylate) block copolymer layer on a neutral layer to form a first phase-separated polystyrene polymer defining a first pattern and a second phase-separated poly(methyl methacrylate) polymer defining a second pattern in the block copolymer layer. The block copolymer is exposed to multiple cycles of an etching plasma and a deposition plasma generated from a gas mixture containing a hydrogen gas and carbon monoxide gas. Each cycle selectively removes a portion of the poly(methyl methacrylate) polymer and deposits a carbon based plasma byproduct onto the polystyrene polymer. Generating the etching plasma from the gas mixture includes adjusting a flow rate of the hydrogen gas, the carbon monoxide gas or a combination thereof into the plasma chamber to provide less than about 99% by volume of carbon monoxide in the gas mixture. Generating the deposition plasma includes adjusting the flow rate of the etchant gas, the carbon monoxide gas or a combination thereof into the plasma chamber to provide greater than about 70% by volume of carbon monoxide in the gas mixture. Each cycle is completed until complete removal of the second phase-separated polymer is achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
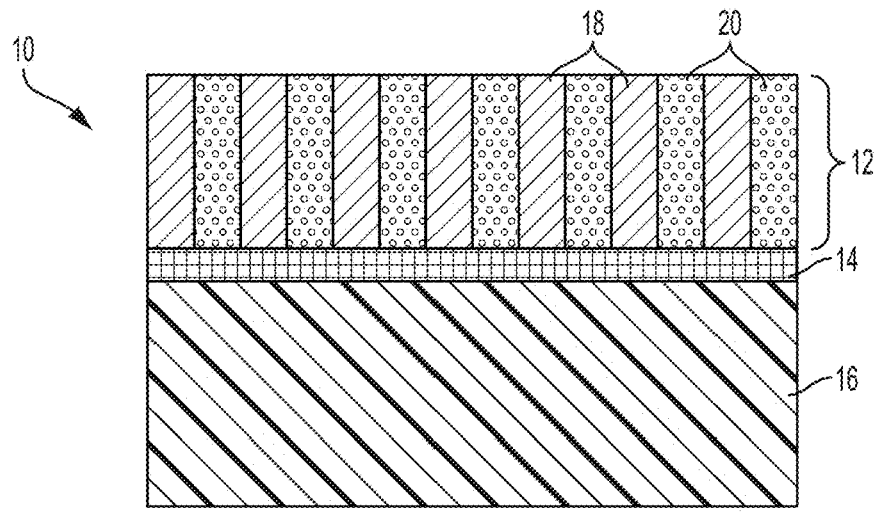
FIG. 1 is a cross sectional view of a structure including a block copolymer deposited onto a neutral layer disposed on a substrate.

It will be appreciated that for simplicity and clarity of illustration, elements shown in the drawings have not necessarily been drawn to scale. For example, the dimensions of some of the elements can be exaggerated relative to other elements for purpose of clarity.

DETAILED DESCRIPTION

The embodiments of the invention described herein are generally directed to dry development processes for selectively removing a block polymer relative to one or more other block polymers in a block copolymer with high selectivity. As will be described in greater detail below, the dry development processes generally include exposing the block copolymer to carbon monoxide-based plasmas generated by periodically gas pulsing the amount of carbon monoxide gas in a carbon monoxide/etchant gas mixture within a plasma apparatus to generate a plasma that cycles between selectively etching a portion of one block polymer relative to the other block polymer(s) and depositing a deposition material onto the exposed surfaces of the other block polymer(s). Multiple cycles can effectively and selectively remove the one block polymer relative to the other block polymer(s) to provide high selectivity with minimal or no change in the thickness of the other block polymer(s). Varying the amount of carbon monoxide gas can be achieved by periodically pulsing increased amounts of the carbon monoxide gas or by periodically pulsing reduced amounts of the etchant gas to change the ratio of the carbon monoxide gas to the etchant gas within the gas mixture so as to change the plasma conditions from etching to deposition. While not wanting to be bound by theory, the deposition material is a plasma byproduct of the carbon monoxide and is believed to be carbon based. The plasma byproduct serves to protect the other block copolymer during the etching cycle.

As used herein, the term "neutral" refers to a surface that does not exhibit a selectivity to one block over another. As used herein, the phrase "block copolymer assembly" or "BCP" refers to a composition including a block copolymer that forms microdomains.

As used herein, the phrase "phase-separate" refers to the propensity of the blocks of the block copolymers to form discrete microphase-separated domains, also referred to as "microdomains" and also simply as "domains." The blocks of the same monomer aggregate to form periodic domains, and the spacing and morphology of domains depends on the interactions, volume fractions, and number of different blocks in the block copolymer. Domains of block copolymers can form during applying, such as during a spin-casting step, during a heating step, or can be tuned by an annealing step. "Heating," also referred to herein as "baking," is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for reducing or removing defects in the layer of lateral microphase-separated domains, and generally involves heating at elevated temperature above the glass transition temperature of the block copolymers, for a period of time (e.g., several minutes to several days) at or near the end of the film-forming process.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

The present invention will now be described more fully hereinafter with reference to the accompanying drawings in which preferred embodiments of the invention are shown. This invention can, however, be embodied in many different forms and should not be construed as limited to the illustrated embodiments set forth herein. Rather, these embodiments are provided so that this description will be thorough and complete, and will fully convey the scope of the invention to those skilled in the art. Like numerals refer to like features throughout.

As noted above, there are two methods used to guide or direct self-assembly of block copolymers onto a surface. These methods include graphoepitaxy and chemoepitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For example, if the block copolymer is a di-block copolymer with A and B blocks within the polymer chain, where A is hydrophilic and B is hydrophobic in nature, the A blocks can assemble into domains formed adjacent to a side-wall of a trench if the side-wall is also hydrophilic in nature. Resolution can be improved over the resolution of the patterned substrate by the block copolymer pattern subdividing the spacing of a pre-pattern on the substrate.

In the chemoepitaxy method, the self-assembly of block copolymer domains is guided by a chemical pattern (i.e., a chemical template) on the substrate. Chemical affinity between the chemical pattern and at least one of the types of copolymer blocks within the block copolymer chain can result in the precise placement (also referred to herein as "pinning") of one of the domain types onto a corresponding region of the chemical pattern on the substrate. For instance, if the block copolymer is a di-block copolymer with A and B blocks, where A is hydrophilic and B is hydrophobic in nature, and the chemical pattern includes of a surface having hydrophobic regions adjacent to regions that are neutral to both A and B, the B domain can preferentially assemble onto the hydrophobic region and consequently force subsequent alignment of both A and B blocks on the neutral areas. As with the graphoepitaxy method of alignment, the resolution can be improved over the resolution of the patterned substrate by the block copolymer pattern subdividing the spacing of pre-patterned features on the substrate (so-called density or frequency multiplication). However, chemoepitaxy is not limited to a linear pre-pattern: for instance, the pre-pattern can be in the form of a 2-D array of dots suitable as a pattern for use with a cylindrical phase-forming block copolymer. Graphoepitaxy and chemi-epitaxy can be used, for instance, to guide the self-organization of lamellar or cylindrical phases, where the different domain types are arranged side-by-side on a surface of a substrate.

Poly(styrene-b-methyl methacrylate) (PS-b-PMMA) is one of the most studied block copolymer for DSA applications. Oxygen ($O_2$) based plasma is typically used for selective removal of the PMMA block polymer relative to the PS block polymer. Although the $O_2$ based plasma gives a low line edge roughness, the PMMA:PS selectively is not very high at about 2:1 because the $O_2$ plasma also etches the PS. In addition, due to the highly reactive nature of $O_2$ based plasmas with polymer materials and the relatively low selectivity, the top portion of the PS block is often rounded. As will be discussed in greater detail below, the dry development process of the present invention provides markedly increased selectivity of one block polymer relative to other block polymer(s). Moreover, the profile of the remaining block polymer remains unchanged, i.e., the original profile is maintained such that there is no rounding.

For ease in understanding the dry development process used in aspects of the present invention, specific reference will be made to the PS-b-PMMA block copolymer. However, it should be apparent that the blocks can in general be any appropriate microdomain-forming block to which another, dissimilar block can be attached. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In one or more embodiments of the invention, the blocks of the block copolymer include as monomers $C_{2-30}$ olefinic monomers, (meth)acrylate monomers derived from $C_{1-30}$ alcohols, inorganic-containing monomers including those based on Fe, Si, Ge, Sn, Al, Ti, or a combination including at least one of the foregoing monomers. In one or more embodiments of the invention, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or α-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth) acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used. Exemplary blocks which are homopolymers can include blocks prepared using styrene (i.e., polystyrene blocks), or (meth)acrylate homopolymeric blocks such as poly(methylmethacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

In addition to the PS-b-PMMA block copolymer previously discussed, other exemplary block copolymers contemplated for use in the present method include diblock or triblock copolymers such as poly(styrene-b-vinyl pyridine), poly(styrene-b-butadiene), poly(styrene-b-isoprene), poly (styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination including at least one of the foregoing block copolymers.

The block copolymer desirably has an overall molecular weight and polydispersity amenable to further processing. In an embodiment, the block copolymer has a weight-averaged molecular weight (Mw) of 3,000 to 100,000 g/mol. Similarly, the block copolymer has a number averaged molecular weight (Mn) of 1,000 to 60,000. The block copolymer can also have a polydispersity (Mw/Mn) of 1.01 to 6, and is not particularly limited thereto. Molecular weight, both Mw and Mn, can be determined by, for example, gel permeation chromatography using a universal calibration method, calibrated to polystyrene standards.

The block copolymer is desirably provided as a solution in an appropriate solvent for any application method selected. The block copolymer is formed on the neutral surface of the substrate on which the chemical pattern can be formed.

Solvents that can be used vary with the solubility requirements of the block copolymer assembly components. Exemplary casting solvents for the block copolymer assembly include propylene glycol monomethyl ether acetate (PGMEA), ethoxyethyl propionate, anisole, ethyl lactate, 2-heptanone, cyclohexanone, amyl acetate, γ-butyrolactone (GBL), toluene, and the like. In an embodiment, specifically useful casting solvents include propylene glycol monomethyl ether acetate (PGMEA), γ-butyrolactone (GBL), or a combination of these solvents.

The block copolymer assembly can include additional components and/or additives selected from the group consisting of: additional polymers, including homopolymers, random copolymers, crosslinkable polymers, inorganic-containing polymers; additives including small molecules, inorganic-containing molecules, surfactants, photoacid generators, thermal acid generators, quenchers, hardeners, crosslinkers, chain extenders, and the like; and combinations including at least one of the foregoing, wherein one or more of the additional components and/or additives co-assemble with the block copolymer to form the block copolymer assembly.

Spin casting (including spin drying) can in some embodiments of the invention suffice to form the block copolymer assembly. In one or more embodiments of the invention, domain formation occurs during applying, baking, annealing, or during a combination of one or more of these operations. In this way, an oriented block copolymer assembly is prepared by the above method, having microphase-separated domains that include cylindrical microdomains oriented perpendicular to the neutral surface, or that include lamellar domains oriented perpendicular to the neutral surface. In one or more embodiments of the invention, the microphase-separated domains are lamellar domains oriented perpendicular to the neutral surface, which provide parallel line/space patterns in the block copolymer assembly.

The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface.

In one or more embodiments of the invention, domains including blocks of the block copolymer assembly form on the chemical pattern, wherein the domains form by lateral segregation of the blocks, at least one domain has an affinity for the pinning regions and forms on the pinning region, and the domains so formed are aligned with the underlying chemical pattern. Domains that do not form on the pinning region form adjacent to and are aligned with the domains formed on the pinning regions, such that a structure including repeating sets of domains is formed on the chemical pattern with a spatial frequency for the domains (given by the number of repeating sets of domains in the given direction) of at least twice that of the spatial frequency for the chemical pattern.

In one or more embodiments of the invention, domains corresponding to each block of a block copolymer are formed. Where a diblock copolymer is used, some domains formed have a greater affinity for the pinning region than the other domain and forms over the pinning regions, the other domains form over a portion of the neutral region that are adjacent to the pinning region. A fraction of the domains having the greater affinity is not pinned. The diblock copolymer assembly then forms additional domains on the neutral region that are adjacent to and aligned with the domains formed on the pinning region. In an embodiment, at least 50% of the domains having the greatest affinity are not pinned.

In one or more embodiments of the invention, polymer structures can be formed by applying a solution including at least one block copolymer, to a neutral surface of a substrate having a chemical pattern thereon, the chemical pattern including alternating pinning and neutral regions which are chemically distinct and which have a first spatial frequency given by the number of paired sets of pinning and neutral regions along a given direction on the substrate; and forming domains including blocks of the block copolymer, where the domains form by lateral segregation of the blocks, wherein at least one domain has an affinity for and forms on the pinning regions, and the pinning regions pin domains having the greatest affinity, such that a structure including repeating sets of pinned domains and domains aligned with the pinned domains is formed on the surface, the structure having a second spatial frequency given by the number of repeating sets of domains in the given direction, the second spatial frequency being at least twice that of the first spatial frequency.

In one or more other embodiments of the invention, polymer structures can be formed by applying a solution including at least one block copolymer, to a neutral surface of a substrate having a chemical pattern thereon, the chemical pattern including alternating pinning and neutral regions that are chemically distinct and have a first spatial frequency given by the number of paired sets of pinning and neutral regions along a given direction on the substrate; and forming domains of the block copolymer which form by lateral segregation of the blocks in accordance with the underlying chemical pattern, wherein at least one domain of the block copolymer assembly has an affinity for the pinning regions, and wherein a structure extending across the chemical pattern is produced, the structure having a uniform second spatial frequency given by the number of repeating sets of domains in the given direction that is at least twice that of the first spatial frequency.

An exemplary process flow for directed self-assembly on sparse chemical patterns thus includes (i) preparing a solution containing at least one block copolymer, optionally with additional block copolymers, homopolymers, surfactants and/or photoacid generators included; (ii) casting the solution on the sparse chemical patterned substrates; (iii) forming well-aligned polymer domains on sparse chemical pattern with frequency multiplication at least twice that of the sparse chemical pattern; (iv) optionally, annealing (including thermal annealing, thermal gradient annealing, solvent vapor annealing or other gradient field) of the block copolymer assembly to remove defects; and (v) selectively removing or decorating aligned polymer domains to generate chemical or topographical contrast for subsequent patterning steps.

A topographical pattern is formed in the block copolymer assembly to provide for transfer of the pattern to the substrate. In a film including the block copolymer assembly having microphase-separated domains, those domains having a common composition can be selectively removed by a suitable process such as wet or dry etch, development, or solvent solubility, so that one domain including one kind of block is selectively removed over another domain including another kind of block. Thus, in one or more embodiments of the invention, a microphase-separated domain of the block copolymer assembly is selectively removed to provide a topographical pattern. The topographical pattern can then be transferred to the substrate by the dry development process of the present invention with high selectivity well in excess of 10:1. In one or more embodiments of the invention, the topographical pattern is generated by selectively etching a domain having a higher etch rate than the other domain(s) by gas pulsing a carbon monoxide based plasma as will be described in FIGS. 1-6.

Referring now to FIG. 1, there is shown a cross sectional view of a structure 10 including a block copolymer 12 deposited onto a neutral layer 14 disposed on a substrate 16. For convenience, reference will hereby be made to a poly(styrene-b-methyl methacrylate) block copolymer, also referred to as PS-PMMA block copolymer. The PS-PMMA block copolymer is solvent deposited and phase segregates in a known manner upon an annealing step to provide alternating PS blocks 18 and PMMA blocks 20, which subsequent to the dry etching process results in lines and spaces that can then be transferred into the substrate as can be desired for some applications. The different blocks, i.e., domains, have about the same thickness and provide the deposited block copolymer with a substantially planar surface.

Figure 2:
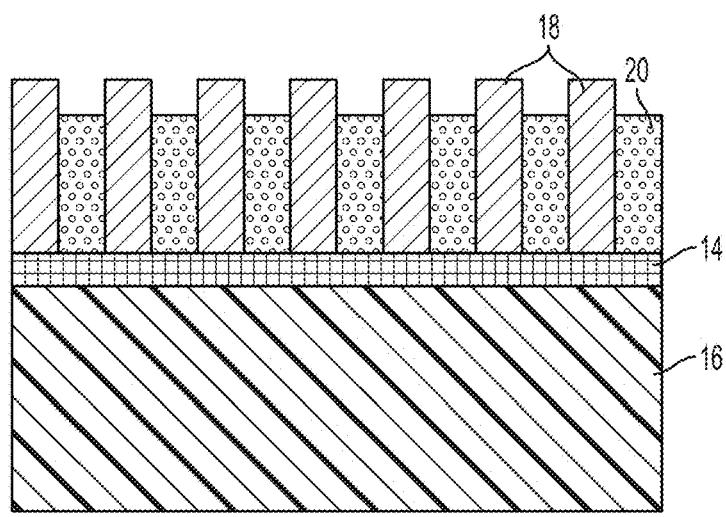
FIG. 2 is a cross sectional view of the structure of FIG. 1 including the block copolymer subsequent to exposure to a carbon monoxide based etching plasma generated in accordance to one or more embodiments of the present invention.

In FIG. 2, the substrate is exposed to a plasma for a period of time, wherein the plasma is formed from a gas mixture including an etchant gas and carbon monoxide gas. The plasma can be configured as an etching plasma or as a deposition plasma. It should be noted that in some embodiments of the invention, the dry etch process according to the present invention can first generate the deposition plasma prior to the etching plasma, which can be continued for multiple cycles to effect removal of one block relative to another block in the block copolymer. In other embodiments of the invention, the dry etch process according to the present invention can first generate the etching plasma prior to the deposition plasma, which can be continued for multiple cycles to effect removal of one block relative to another block in the block copolymer. The etchant gas is not intended to be limited and can be hydrogen gas ($H_2$), ammonia ($NH_3$), oxygen ($O_2$), carbon dioxide ($CO_2$), mixtures thereof or the like.

Generally, for plasma etching the amount by volume of the etchant gas in the gas mixture is typically greater than about 0.5% to 100% and will generally depend on the particular etchant gas. By way of example, the amount by volume of a hydrogen ($H_2$) etchant gas in the gas mixture is greater than about 40% to 100% for plasma etching to occur. In contrast, the amount of oxygen gas ($O_2$) in the gas mixture to provide plasma etching can be greater than about 1%. The etching plasma generated from the gas flow mixture generates reactive ions selective to the PMMA block polymer, which results in removal of a portion thereof as shown.

Figure 3:
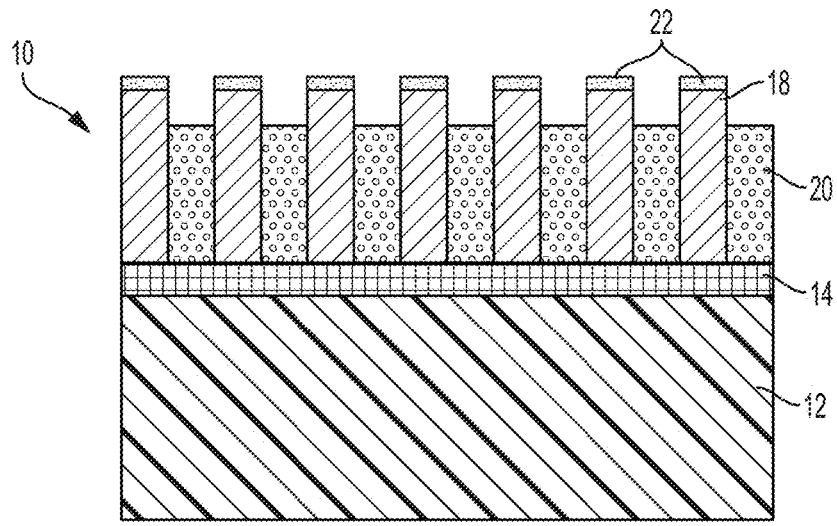
FIG. 3 is a cross sectional view of the structure of FIG. 2 including the block copolymer subsequent to exposure to a carbon monoxide based deposition plasma generated in accordance to one or more embodiments of the present invention.

In FIG. 3, the ratio of etchant gas to carbon monoxide gas relative to the gas mixture used for etching is decreased to provide the deposition plasma, which can be decreased by increasing the flow of carbon monoxide gas to form the gas mixture or by decreasing the flow of etchant gas to form the gas mixture or a combination of increasing the flow of carbon monoxide gas and decreasing the flow of the etchant gas flow. The amount of the carbon monoxide gas in the gas mixture to generate the deposition plasma is generally such that the gas mixture contains about 70 to about 100 percent by volume carbon monoxide relative to the etchant gas. For more aggressive etching gases such as the oxygen gas discussed above, the deposition plasma will include a gas mixture including greater than about 99% carbon monoxide. The plasma resulting from the gas mixture causes film deposition of a carbon-based plasma byproduct 22, which, while not wanting to be bound by theory, is believed to be a plasma byproduct of the carbon monoxide and is deposited onto the PS block 18 as shown. Etching of the PMMA or the PS domains does not occur to any measureable degree.

Figure 4:
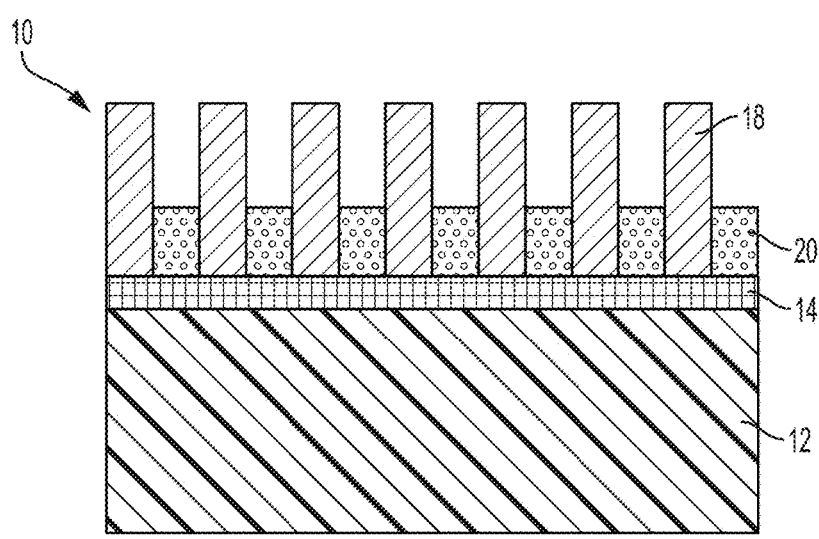
FIG. 4 is a cross sectional view of the structure of FIG. 3 including the block copolymer subsequent to exposure to a carbon monoxide based etching plasma generated in accordance to one or more embodiments of the present invention
Figure 5:
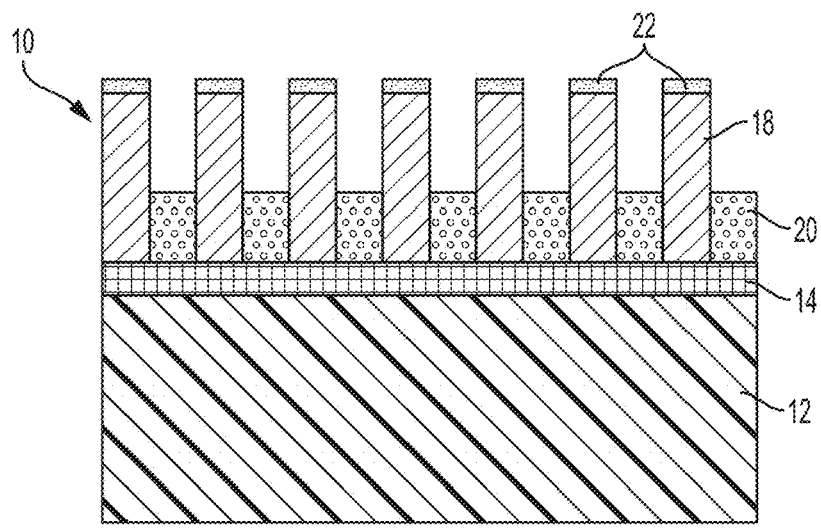
FIG. 5 is a cross sectional view of the structure of FIG. 4 including the block copolymer subsequent to exposure to a carbon monoxide based deposition plasma generated in accordance to one or more embodiments of the present invention
Figure 6:
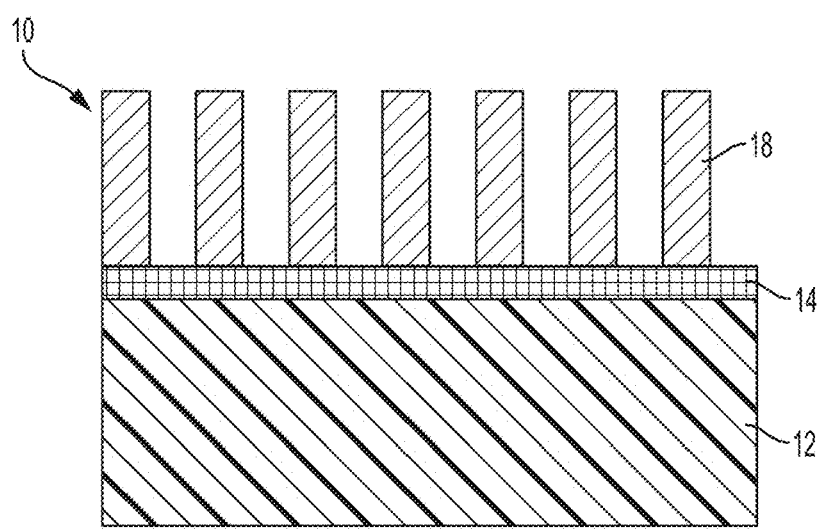
FIG. 6 is a cross sectional view of the structure of FIG. 5 including the block copolymer subsequent to exposure to a carbon monoxide based etching plasma generated in accordance to one or more embodiments of the present invention FIG. 7 graphically illustrates gas pulsing of a gas mixture containing hydrogen gas and carbon monoxide into a plasma apparatus to generate multiple cycles of an etching plasma and a deposition plasma in accordance to one or more embodiments of the present invention.

As will be shown in the remaining FIGS. 4-6, the etching and deposition plasmas are periodically cycled for multiple cycles to cause etching and deposition to occur. The period of time for each individual cycle of etching plasma or deposition plasma is generally from 1 to 60 seconds. In one or more embodiments of the invention, each cycle of plasma etching and deposition can be the same or can be varied depending on the particular application. Likewise, the period of time for the etching plasma and/or the deposition plasma within a cycle can be the same or different.

In FIG. 4, the ratio of the etchant gas to the carbon monoxide is increased to form the etching plasma, wherein another portion of the PMMA domains is selectively removed relative to the PS domains.

In FIG. 5, the ratio of the etchant gas to the carbon monoxide is decreased to form the deposition plasma, wherein a carbon based etching byproduct 22 of the carbon monoxide is believed to form and become deposited onto the patterned PS blocks 18.

In FIG. 6, the ratio of the etchant gas to the carbon monoxide is increased to form the etching plasma, wherein a remaining portion of the PMMA block polymer is selectively removed relative to the PS block polymer. As shown, the PMMA block polymer is removed completely from the substrate, whereas the original thickness and profile of the PS domains are substantially the same. The number of cycles will generally depend on the etchant gas, the ratio of the etchant gas to carbon monoxide, the period of time for each cycle, the thickness of the BCP, and the like. Generally, the etching and deposition plasma are configured to effect complete removal of one block to relative to another block in less than 10 cycles, wherein 1 cycle refers to the combination of etching plasma and a deposition plasma.

In one or more embodiments of the invention, the etching cycle is plasma to remove the neutral layer underlying the removed PMMA block polymer.

The following examples will provide detailed illustrations of the dry development methods of the present invention. These examples are not intended, however, to limit or restrict the scope of the invention in any way and should not be construed as providing conditions, parameters or values which must be utilized exclusively in order to practice the present invention.

Example 1

In this example, a neutral layer (EMD NLD-089 from AZ Electronic Materials. Inc. was spin coated at 2000 revolutions per minute (rpm) and baked at about 220° C. for 2 minutes. PS-b-PMMA was spin coated at 1500 rpm and baked at 250° C. for 2 minutes under a nitrogen gas flow to provide a combined thickness of the PS-b-PMMA and neutral layer of about 35 nanometers.

Figure 7:
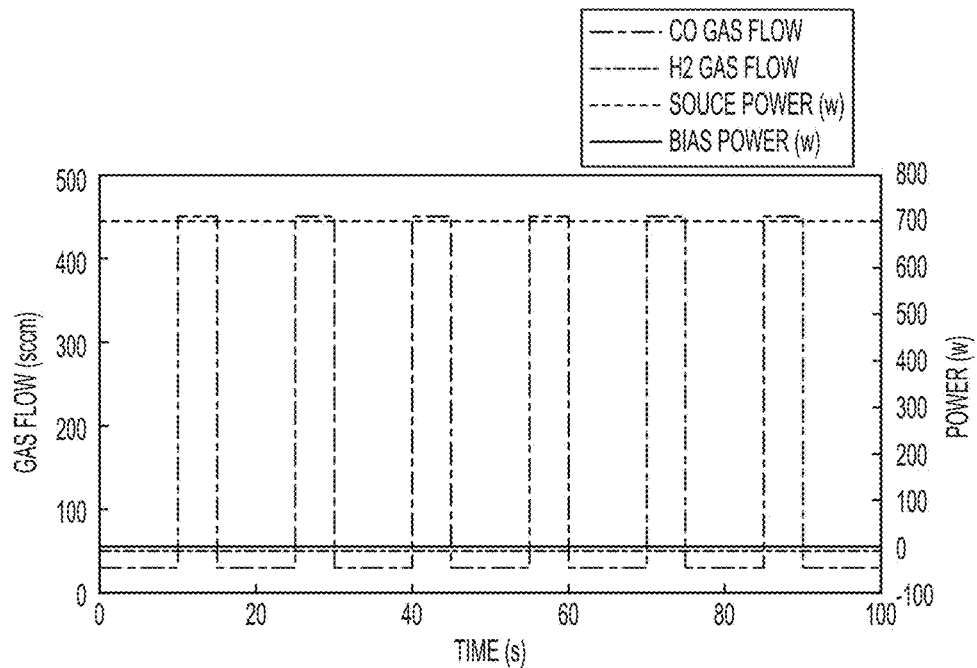

FIG. 7 graphically illustrates a gas pulsing profile used for etching the 28 nm pitch PS-b-PMMA block copolymer coated onto the silicon wafer. The gas pulsing profile was generated with a gas mixture of hydrogen gas and carbon monoxide gas, wherein the hydrogen gas was at 10 or 50% of the total gas flow into a capacitively coupled plasma etch chamber at a pressure of 10 milliTorr (mT), source power of 700 Watts (W), and a bias power of 0 W. The flow rate of the carbon monoxide was periodically switched from about 50 standard cubic centimeters per minute (sccm) for 10 seconds to about 450 sccm for 5 seconds while the hydrogen gas flow rate was constant at about 50 sccm. Etching occurred during the 10 seconds when the plasma was generated from a gas mixture of about 50% hydrogen and 50% carbon monoxide based on the flow rates and deposition occurred during the 5 seconds when the plasma was generated from a gas mixture of about 10% hydrogen and 90% carbon monoxide based on the flow rates.

Figure 8:
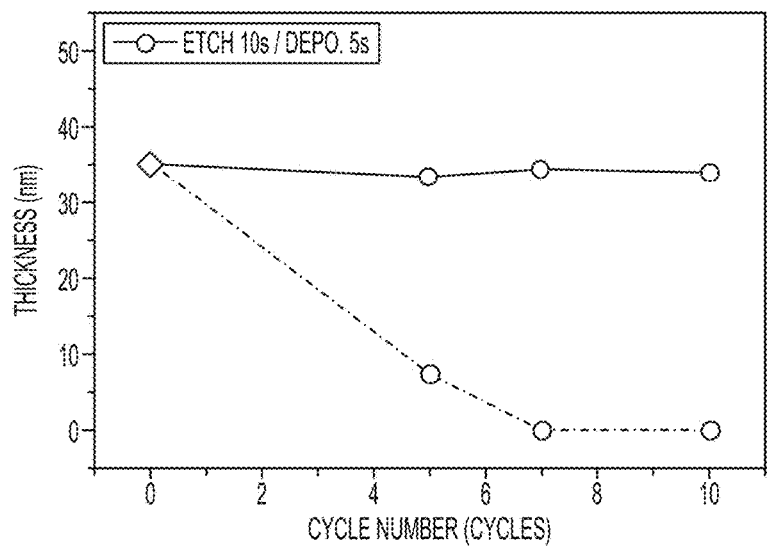
FIG. 8 graphically illustrates thickness as a function of cycle number of a PS-b-PMMA block copolymer subsequent to exposure to gas pulsing of a carbon monoxide based plasma in accordance to one or more embodiments of the present invention.

FIG. 8 graphically illustrates thickness as a function of cycle number. The thickness of the PS domains was substantially constant during the dry development process whereas the thickness of the PMMA domains were step-wise removed after each cycle and was completely removed after about 7 cycles.

Figure 9A:
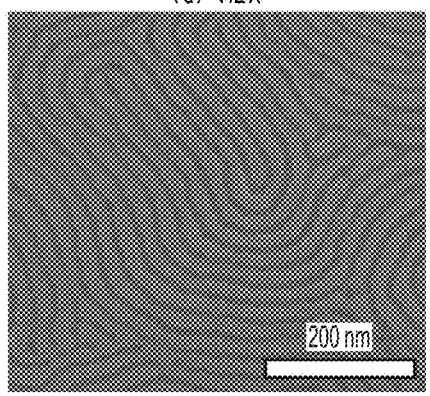
FIG. 9A is a top down micrograph of a patterned PS-b-PMMA block copolymer subsequent to selective removal of the PMMA block polymer in accordance with embodiments of the present invention.

FIG. 9A depicts a top view and a 70° tilted view after 10 cycles of gas pulsing the carbon monoxide plasma of the PS-b-PMMA film at the 28 nm pitch. Each cycle included an etching plasma ($H_2$=50 sccm. CO=50 sccm) for 10 seconds and a deposition plasma ($H_2$=50 sccm, CO=450 sccm) of 5 seconds. The PS profile is relatively square and not rounded to any significant degree.

Figure 9B:
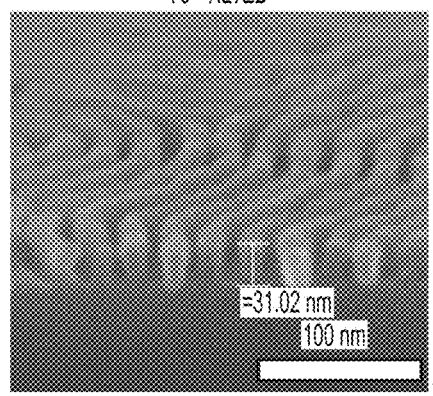
FIG. 9B is a tilted micrograph of a patterned PS-b-PMMA block copolymer subsequent to selective removal of the PMMA block polymer in accordance with embodiments of the present invention.

FIG. 9B depicts a 70° tilted view after 10 cycles of gas pulsing the carbon monoxide plasma of the PS-b-PMMA film at the 28 nm pitch. Each cycle included an etching plasma ($H_2$=50 sccm, CO=50 sccm) for 10 seconds and a deposition plasma ($H_2$=50 sccm, CO=450 sccm) of 5 seconds. The PS profile is relatively square and not rounded to any significant degree.

Articles can be prepared using the method described hereinabove. As one example, one or more aspects of the present invention can be included in an article of manufacture, e.g., one or more computer hardware products such as permanent or rewriteable data storage media such as hard disks readable by a machine, employing, for instance, computer usable media. The media has embodied therein, for instance, computer readable program code means for providing and facilitating the capabilities of the present invention. The article of manufacture can be included as a part of a computer system or sold separately. Other exemplary applications include fabrication of semiconductors including microprocessors, ASICs, and/or memory chips including DRAM. SRAM. Flash, and the like.

The flow diagrams of the figures depicted herein are just examples. There can be many variations to these diagrams or the steps (or operations) described therein without departing from the spirit of the invention. For instance, the steps can be performed in a differing order, or steps can be added, deleted or modified. All of these variations are considered a part of the claimed invention.

It will be understood that when an element, such as a layer, is referred to as being "on" or "over" another element, it can be directly on the other element or intervening elements can also be present. In contrast, when an element is referred to as being "directly on" or "directly over" another element, there are no intervening elements present.

While the present invention has been particularly shown and described with respect to embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A dry development method for preparing a patterned directed self-assembly layer, the dry development method comprising:
providing a substrate having a block copolymer layer comprising a first phase-separated polymer defining a first pattern in the block copolymer layer and a second phase-separated polymer defining a second pattern in the block copolymer layer; and
exposing the block copolymer to a carbon monoxide-based plasma that cycles between selectively etching a portion of the first phase-separated polymer and depositing a deposition material onto the exposed surfaces of the second phase-separated polymer of the block copolymer.

2. The dry development method of claim 1, wherein exposing the block copolymer to the carbon monoxide-based plasma comprises pulsing an amount of carbon monoxide gas in carbon monoxide/etchant gas mixture.

3. The dry development method of claim 1, wherein depositing the deposition material onto the exposed surfaces of the other block polymer comprises forming the carbon monoxide based plasma with about 70 to 100% by volume of the carbon monoxide gas in the gas mixture.

4. The dry development method of claim 1, wherein the cycles comprise repeatedly exposing the block copolymer layer to the etching plasma to selectively remove a portion of the second phase-separated polymer followed by the deposition plasma to deposit a carbon based etching byproduct on surfaces of the first phase-separated polymer, wherein providing the multiple cycles is repeated until complete removal of the second phase-separated polymer.

5. The dry development method of claim 1, wherein the etching is for a duration of about 1 to about 60 seconds and the deposition is for a duration of about 1 to about 60 seconds within each cycle.

6. The dry development method of claim 1, wherein the etching is for a duration of about 1 to about 20 seconds and the deposition is for a duration of about 1 to about 20 seconds within each cycle.

7. The dry development method of claim 1, wherein the carbon monoxide-based plasma is formed from a gas mixture consisting of hydrogen gas and carbon monoxide gas, wherein the selective etching plasma comprises the hydrogen gas in an amount of about 40% to about 100% of the gas mixture, and the deposition plasma comprises the hydrogen gas in an amount less than about 30% of the gas mixture.

8. The dry development method of claim 1, wherein the etchant gas comprises hydrogen gas, ammonia, oxygen, carbon dioxide, or combinations thereof.

9. The dry development method of claim 1, wherein:
the block copolymer comprises poly(styrene-b-methyl methacrylate);
the first phase-segregated polymer comprises poly(methyl methacrylate); and
the second phase-segregated polymer comprises polystyrene.

10. The dry development method of claim 1, wherein the block copolymer is selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the foregoing block copolymers.

11. The dry development method of claim 1, wherein the block copolymer provides a cylinder pattern.

12. The dry development method of claim 1, wherein the block copolymer provides a line space pattern.

13. The dry development method of claim 1, wherein the block copolymer his selected to have a weight-averaged molecular weight (Mw) of 3,000 to 100,000 g/mol.

* * * * *